(12) United States Patent
Leobandung (10) Patent No.: US 10,559,493 B1
(45) Date of Patent: Feb. 11, 2020

(54) MULTIFUNCTION SINGLE VIA PATTERNING

(71) Applicant: INTERNATIONAL BUSINESS MACHINES CORPORATION, Armonk, NY (US)

(72) Inventor: Effendi Leobandung, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/126,178

(22) Filed: Sep. 10, 2018

(51) Int. Cl.
  *H01L 21/00* (2006.01)
  *H01L 21/768* (2006.01)
  *H01L 45/00* (2006.01)

(52) U.S. Cl.
  CPC .. *H01L 21/76816* (2013.01); *H01L 21/76807* (2013.01); *H01L 45/1233* (2013.01); *H01L 45/1675* (2013.01); *H01L 2221/1026* (2013.01)

(58) Field of Classification Search
  CPC ......... H01L 21/76816; H01L 21/76807; H01L 45/1233; H01L 45/1675; H01L 2221/1026
  See application file for complete search history.

(56) References Cited

U.S. PATENT DOCUMENTS

| | | | |
|---|---|---|---|
| 7,671,355 B2 | 3/2010 | Kuo et al. | |
| 8,809,828 B2 | 8/2014 | Breitwisch et al. | |
| 9,431,604 B2 | 8/2016 | Liao et al. | |
| 10,204,789 B2 * | 2/2019 | Ogata | H01L 29/66833 |
| 2013/0051117 A1 | 2/2013 | En et al. | |
| 2015/0318333 A1 | 11/2015 | Narayanan et al. | |
| 2016/0204002 A1 | 7/2016 | Wallace et al. | |
| 2017/0084833 A1 | 3/2017 | Zanderighi et al. | |
| 2018/0374865 A1 * | 12/2018 | Shimabukuro | H01L 27/11582 |

* cited by examiner

*Primary Examiner* — Kimberly N Rizkallah
*Assistant Examiner* — Alexander Belousov
(74) *Attorney, Agent, or Firm* — Tutunjian & Bitetto, P.C.; Vazken Alexanian (57) ABSTRACT

A method for semiconductor device fabrication includes forming storage elements on conductive structures. A cap layer is deposited over the storage elements and the conductive structures. An interlevel dielectric (ILD) layer is formed over the cap layer. Trenches are patterned in the ILD layer to expose a top portion of the storage elements. The storage elements where interlevel vias are to be formed is removed to expose the conductive structures therebelow to form via openings. A conductive material is deposited in the trenches and the via openings to concurrently make contact with the storage elements and form interlevel vias in the via openings.

16 Claims, 11 Drawing Sheets

MULTIFUNCTION SINGLE VIA PATTERNING

BACKGROUND

Technical Field

The present invention generally relates to semiconductor processing, and more particularly to a back end of the line (BEOL) process to form an energy storage element that is fabricated concurrently with vias.

Description of the Related Art

Semiconductor devices include metal layers. The metal layers can include metal lines or interlevel connections called vias or contacts. The vias or contacts provide vertical connections within a stack of layers of the semiconductor device. The vias can land on components such as source regions, drain regions, gate conductors, metal lines, other vias, etc. The vias can be formed by patterning a dielectric layer to form trenches. The dielectric layer can be patterned by exposing a resist to radiation through a lithographic mask and then developing the resist to create a pattern and in accordance with the lithographic mask. Next, trenches are etched into the dielectric layer through an etch mask (formed in the resist or in a hard mask patterned by etching through the resist). The trenches need to align with underlying structures. The trenches can then be filled with a conductive material and planarized to form the vias or contacts. The process can continue with the formation of additional metal layers with metal lines or vias/contacts.

SUMMARY

In accordance with an embodiment of the present invention, a method for semiconductor device fabrication includes forming storage elements on conductive structures. A cap layer is deposited over the storage elements and the conductive structures. An interlevel dielectric (ILD) layer is formed over the cap layer. Trenches are patterned in the ILD layer to expose a top portion of the storage elements. The storage elements where interlevel vias are to be formed is removed to expose the conductive structures therebelow to form via openings. A conductive material is deposited in the trenches and the via openings to concurrently make contact with the storage elements and form interlevel vias in the via openings.

Another method for semiconductor device fabrication includes forming a stack of layers over an underlying layer having conductive structures formed therein, the stack of layers including at least an electrode layer and a memory material layer; patterning the stack of layers to form storage elements on conductive structures; depositing a cap layer over the storage elements and the conductive structures; forming an interlevel dielectric (ILD) layer over the cap layer; patterning trenches in the ILD layer to expose a top portion of the storage elements; removing the storage elements where interlevel vias are to be formed to expose the conductive structures therebelow to form via openings; and depositing a conductive material in the trenches and the via openings to concurrently make contact with the storage elements and form interlevel vias in the via openings.

A semiconductor device includes a storage element formed within a metal layer and over an underlying layer having conductive structures, the storage element including at least one electrode layer and a memory material layer. A cap layer is formed on sidewalls of the storage elements and over the conductive structures. An interlevel dielectric (ILD) layer is disposed on the cap layer. An interlevel via is formed through the ILD layer in the same metal layer as the storage element and having a same height as the storage element.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

In accordance with aspects of the present invention, energy storage element, such as memory devices, or other useful structures can be introduced into metal layers of a structure. In one useful embodiment, memory devices can be formed as, e.g., back end of the line (BEOL) devices and formed concurrently with metal contacts or vias. In this way, the memory device and a via can be formed within a same metal layer using a same fabrication procedure, hence multiple functions in a single via patterning. The memory devices and the vias can be co-integrated using a same single exposure patterning process.

By forming the BEOL memory device and the vias in a same process, long vias are avoided. For example, if a memory device stack were formed on a first level, the height of the stack would take up a portion of a metal layer to be formed. To connect to the memory stack, a short via would need to be formed on top of the stack to make up the remaining distance in the metal layer. If a standard via were to be formed in the same layer to vertically connect components, the standard via would need to be long, e.g., the height of the memory stack and the height of the via to the top of the memory stack. To form both the short and long vias in a same metal layer would need two patterning exposure processes.

In accordance with one embodiment, an element is formed within a height of a via. The element can include a memory element, such as, e.g., a phase change memory (PCM) element, a resistive random access memory (RRAM) element or other memory or energy storage element. The element also can include a resistor, capacitor or other impedance device. The element can include a tiered via having a plurality of different constituent layered materials in its height.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Figure 1:
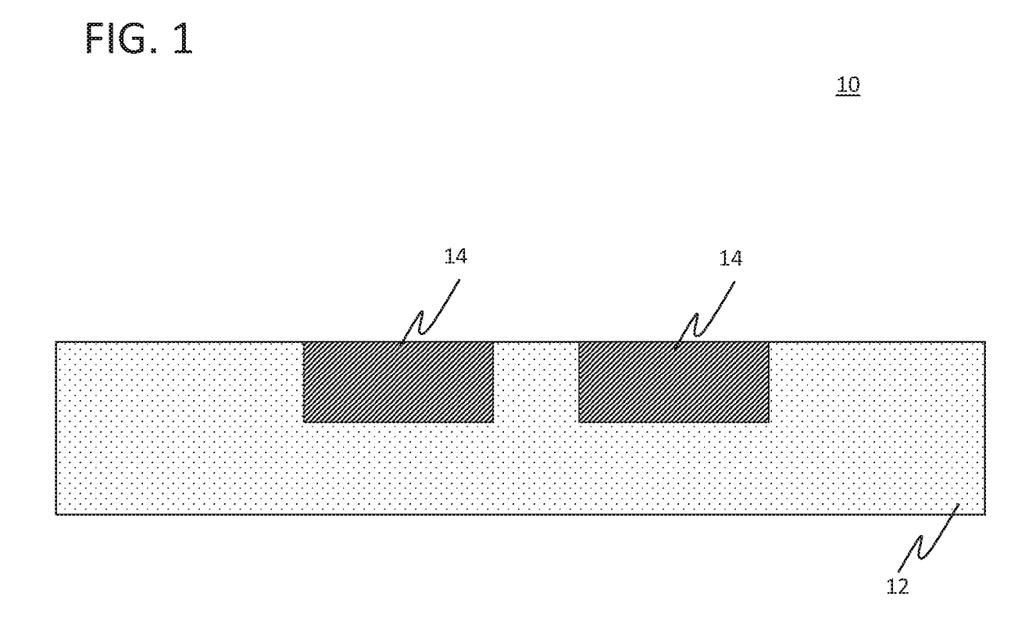
FIG. 1 is a cross-sectional view showing an underlying layer with conductive structures formed therein in accordance with an embodiment of the present invention.

Referring now to the drawings in which like numerals represent the same or similar elements and initially to FIG. 1, a semiconductor device 10 is shown in accordance with one embodiment. The device 10 includes a substrate or metal layer 12 depending on the position in the fabrication process where the present embodiments are employed. The substrate or metal layer 12 can include multiple layers. In one embodiment, the substrate 12 can include any suitable substrate structure, e.g., a bulk semiconductor, a semiconductor-on-insulator (SOI) substrate, etc.

In one example, the substrate 12 can include a semiconductor wafer having metal or conductive structures 14 formed therein or thereon. The substrate 12 can include a silicon-containing material. Illustrative examples of Si-containing materials suitable for the substrate 12 can include, but are not limited to, Si, SiGe, SiGeC, SiC and multi-layers thereof. Although silicon is the predominantly used semiconductor material in wafer fabrication, alternative semiconductor materials can be employed as additional layers, such as, but not limited to, germanium, gallium arsenide, gallium nitride, silicon germanium, cadmium telluride, zinc selenide, etc. The structures 14 can include doped regions, silicided regions or other conductive regions.

In another example, instead of a substrate, a metal layer 12 can be employed. The metal layer 12 can include an interlevel dielectric (ILD) layer (e.g., an oxide, a nitride, an organic dielectric or other suitable dielectric materials). The ILD layer 12 can be a middle or back end of the line (BEOL) layer. In this case, the conductive structures 14 can include metal lines, vias or other conductive regions. In either case, layer 12 and structures 14 provide a prior metal layer or level with the conductive structures 14 exposed for further processing. The conductive structures 14 can include, a metal, e.g., tungsten, titanium, tantalum, ruthenium, zirconium, cobalt, copper, aluminum, lead, platinum, tin, silver, gold), a conducting metallic compound material (e.g., tantalum nitride, titanium nitride, tungsten silicide, tungsten nitride, ruthenium oxide, cobalt silicide, nickel silicide), conductive carbon, carbon nanotube, graphene, or any suitable combination of these materials.

Figure 2:
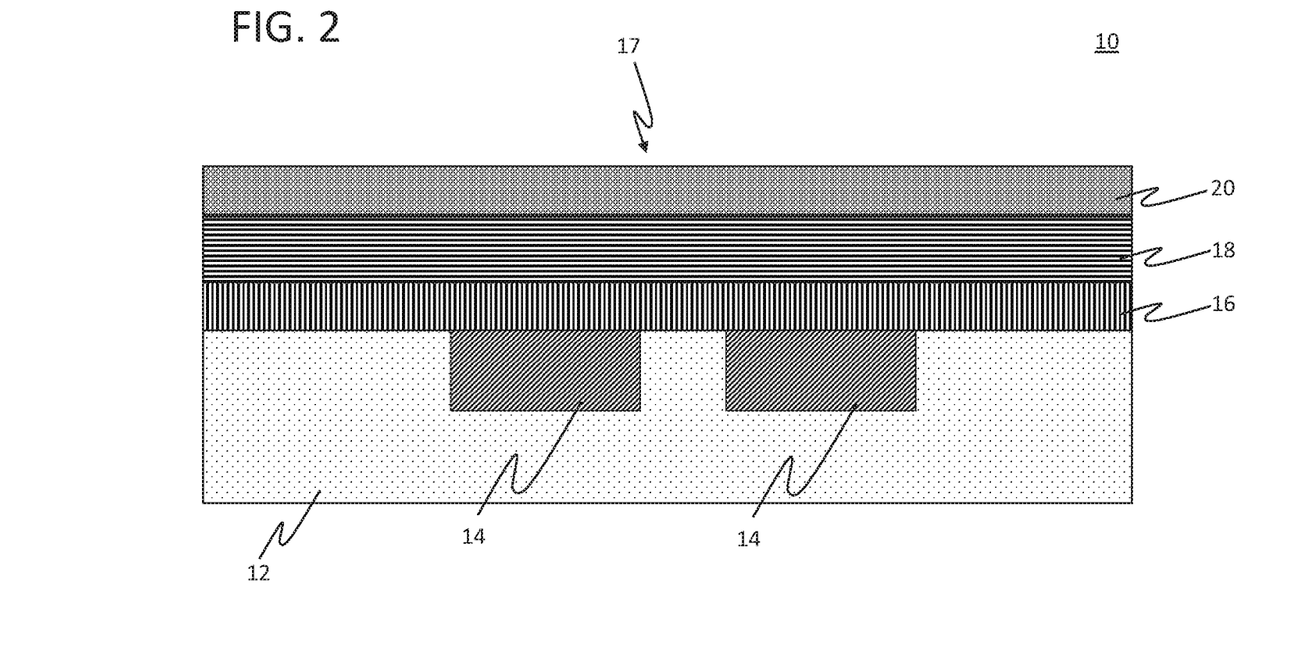
FIG. 2 is a cross-sectional view showing the underlying layer with conductive structures of FIG. 1 having a stack of layers formed thereon in accordance with an embodiment of the present invention.

Referring to FIG. 2, in one embodiment, a memory element is formed within a height of a normal interlevel via. In one example, a phase change memory (PCM) element is formed. A phase change memory stack 17 can be formed by depositing layers over the layer 12 and the conductive structures 14.

The memory stack 17 can include phase change material in layer 18 sandwiched between layers 16, 20. Layer 16 will form an electrode for the PCM memory element. Other elements may also be included in the stack 17. For example, additional layers, electrodes or materials can be employed as needed.

The memory stack 17 can include storage element (PCM) material 18, electrode material 16 and selector or electrode material in layer 20. The electrode layers 16, 20 can include metals similar to those described for structure 14. If a selector (not shown) is employed an additional electrode (e.g., a middle electrode can be employed as well). The storage element material 18 can include a PCM cell and the selector, if employed, can include, e.g., an Ovonic Threshold Switch (OTS) or the like.

The memory stack 17 can be deposited using suitable deposition techniques. In one example, the layers are deposited separately using chemical vapor deposition (CVD), although physical vapor deposition (PVD) (e.g., evaporation, sputtering) or other techniques can be employed.

The phase change material 18 can include chalcogenide elements such as germanium (Ge), antimony (Sb), tellurium (Te), indium (In) as well as other chalcogenide elements, combinations of these elements, or combinations of these elements with other elements. The phase change material 18 can additionally include aluminum (Al), gallium (Ga), tin (Sn), bismuth (Bi), sulphur (S), oxygen (O), gold (Au), palladium (Pd), copper (Cu), cobalt (Co), silver (Ag), or platinum (Pt) as well as other elements. Other embodiments can combine these additional elements with the chalcogenide elements.

PCM elements can include materials capable of stably transitioning between amorphous and crystalline phases. Each phase exhibits a particular resistance state and the resistance states distinguish the state values of the memory element. For example, an amorphous state provides a relatively high resistance and a crystalline state provides a relatively low resistance.

In an alternate embodiment, the material 20 can include resistive materials useful in resistive random access memories (RRAMs) and layers 16 and 20 can include electrodes. The resistive materials, which are normally insulating become conductive under high enough voltages. The resistive material 20 can include phase-change chalcogenides such as $Ge_2Sb_2Te_5$ or AgInSbTe; binary transition metal oxides, such as, NiO or $TiO_2$; perovskites, such as, Sr(Zr)$TiO_3$ or PCMO, solid-state electrolytes such as GeS, GeSe, SiO, or $Cu_2S$; organic charge-transfer complexes, organic donor-acceptor systems; two dimensional (layered) insulating materials like hexagonal boron nitride, etc.

Figure 3:
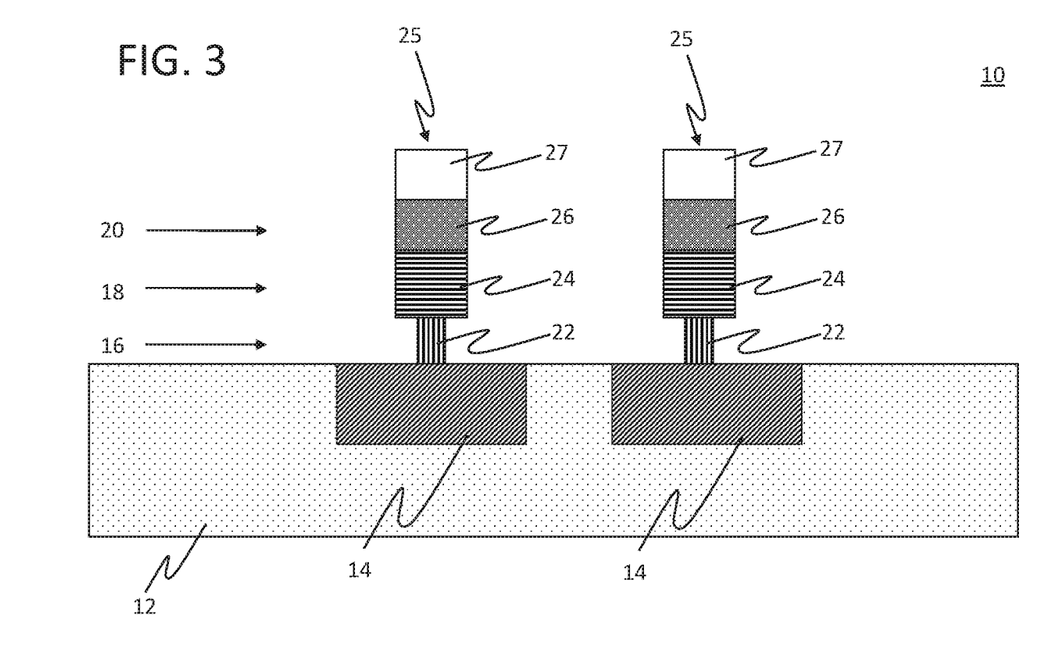
FIG. 3 is a cross-sectional view showing the stack of layers of FIG. 2 patterned on the conductive structures to form memory elements or storage elements in accordance with an embodiment of the present invention.

Referring to FIG. 3, a patterning process is performed to create an etch mask 27 to pattern the stack 17. The etch mask can include a resist or a resist with a hard mask or other layers. The resist pattern is exposed and developed to remain at locations where memory elements 25 are to be formed. The memory elements 25 are positioned over and in contact with the underlying conductive regions or structures 14. The memory elements 25 can include PCM elements, RRAM elements or other memory elements. The memory elements 25 are etched from the stack 17 (FIG. 2) using and anisotropic etch process, such as a reactive ion etch (RIE) or similar etch process. Since the electrode layers 16, 20 and layer 18 are formed from different materials, other types of etching processes may be employed to control the shapes of the layers 16, 18 and 20 relative to one another. For example, in one embodiment, a bottom electrode 22 can be formed to be narrower than the storage region 24 (and top electrode 26) by selecting an etch chemistry and process during the patterning of the stack 17. In one example, a wet etch can be employed after the RIE to narrow the bottom electrode 22. After the etching is performed, the resist 27 (and any hard mask layers) can be stripped from the top electrode 26.

Figure 4:
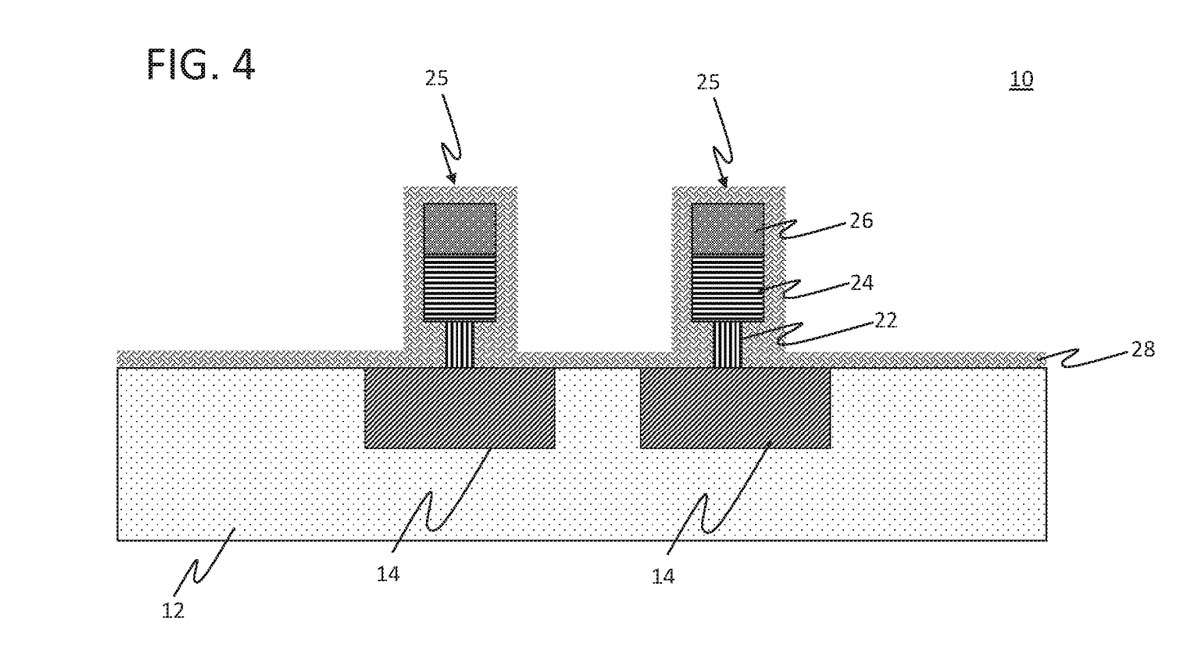
FIG. 4 is a cross-sectional view showing a cap layer formed over the conductive structures and the memory elements of FIG. 3 in accordance with an embodiment of the present invention.

Referring to FIG. 4, a dielectric cap layer 28 is deposited over the layer 12, conductive structures 14 and the memory elements 25. The undercuts of the bottom electrode 22 below the storage region 24 are filled by the deposition of the dielectric cap layer 28. The dielectric cap layer 28 can be deposited by a CVD process. The cap layer 28 can be employed to adjust the dimensions of a via to be formed later in the process by adding width and height to the memory elements 25. The cap layer 28 also protects the memory elements 25 and can act as an etch stop layer on the surface of the layer 12 or on conductive structures 14. The cap layers 28 can include a nitride, such as a silicon nitride. Other materials can also be employed, e.g., oxides, such as silicon dioxide, or metal oxides, (e.g., titanium oxides, aluminum oxides, etc.).

Figure 5:
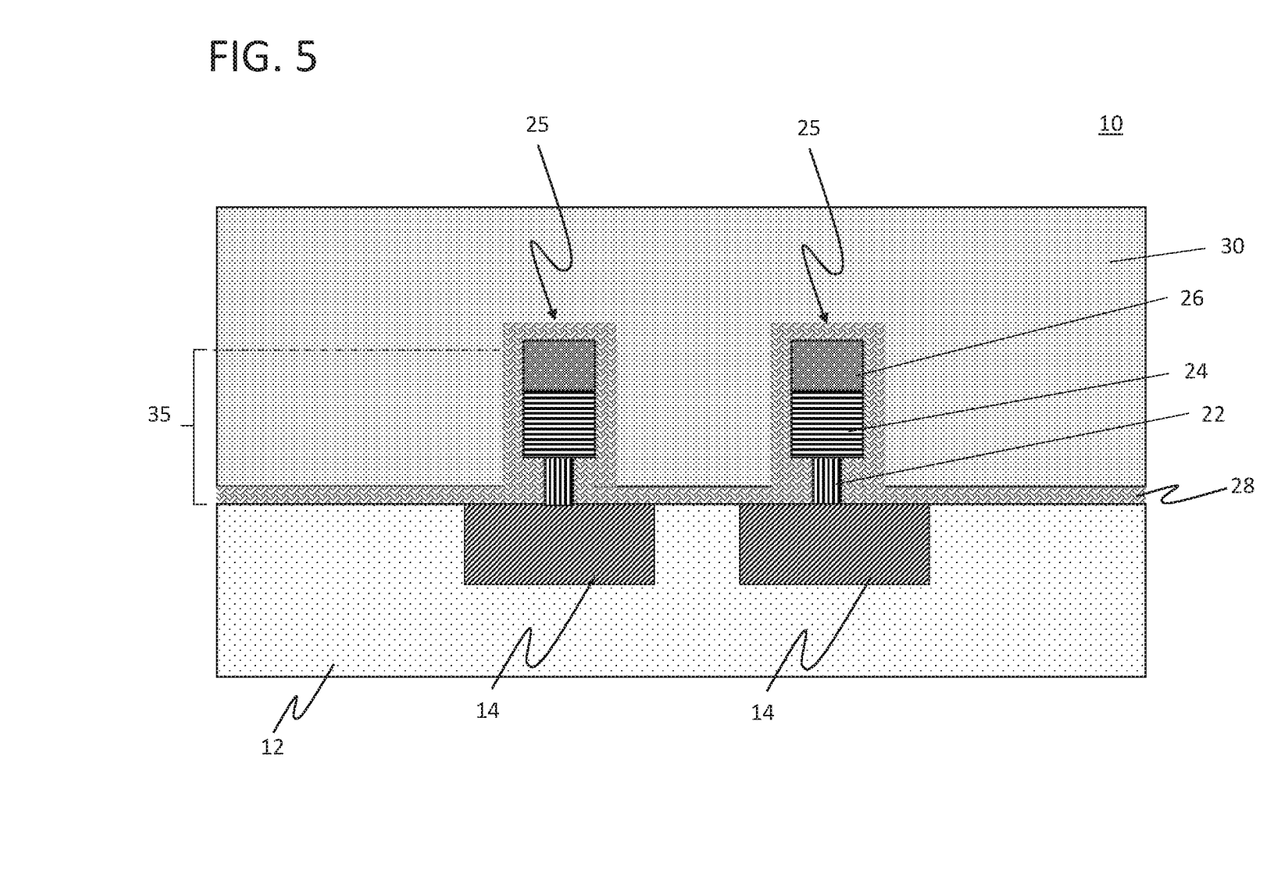
FIG. 5 is a cross-sectional view showing an interlevel dielectric layer formed on the cap layer of FIG. 4 in accordance with an embodiment of the present invention.

Referring to FIG. 5, an interlevel dielectric (ILD) layer 30 is deposited and planarized (e.g., by a chemical mechanical polish (CMP)). The deposition process can include a CVD process, a spin-on process or any other suitable process. The dielectric layer 30 can include any suitable ILD layer materials. In one embodiment the ILD layer 30 includes silicon oxide. Other embodiments, can employ other inorganic or organic dielectric materials.

The dielectric layer 30 and the cap layer 28 represent a thickness or height 35 allocated for a metal layer (e.g., M1 or M2, etc.). In other words, a normal via height would be employed within the thickness 35. The thickness 35 can be adjusted as needed, however, to provide enough height to form the needed memory element structures without having vias that are too long (e.g., higher than a normal via in a metal layer).

Figure 6:
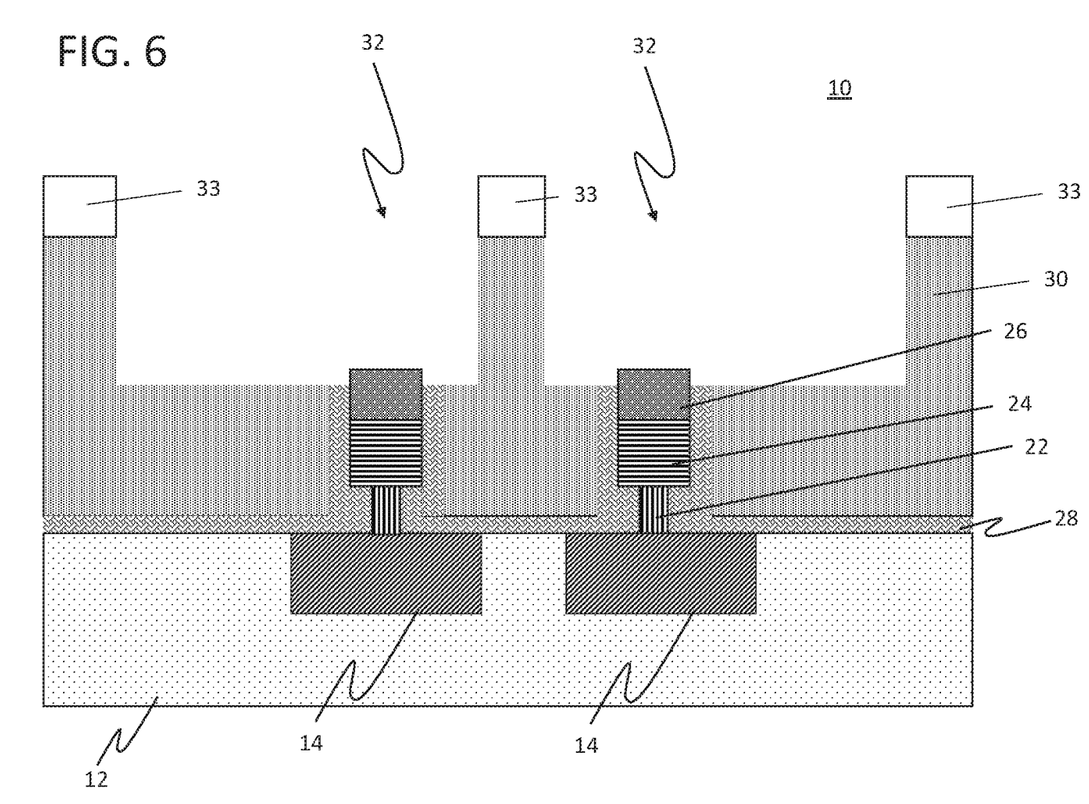
FIG. 6 is a cross-sectional view showing the interlevel dielectric layer opened up to form trenches exposing the storage elements of FIG. 4 through the cap layer in accordance with an embodiment of the present invention.

Referring to FIG. 6, trenches 32 are formed in the ILD layer 30. The trenches 32 are formed using a single exposure resist/lithography process to create an etch mask 33. Then, the etch mask 33 is employed to pattern the ILD layer 30. The etch process can include a RIE or other anisotropic etch process. The etch removes material to form trenches 32 and etches through the cap layer 28 to expose the top electrodes 26. Under other conditions, a memory element would have needed a separate exposure process to form an intermediary via. Here, the single exposure resist/patterning is employed to form both an opening to the memory element in one instance and expose the conductive structure 14 in another instance within the same (metal) layer, as will be described.

Figure 7:
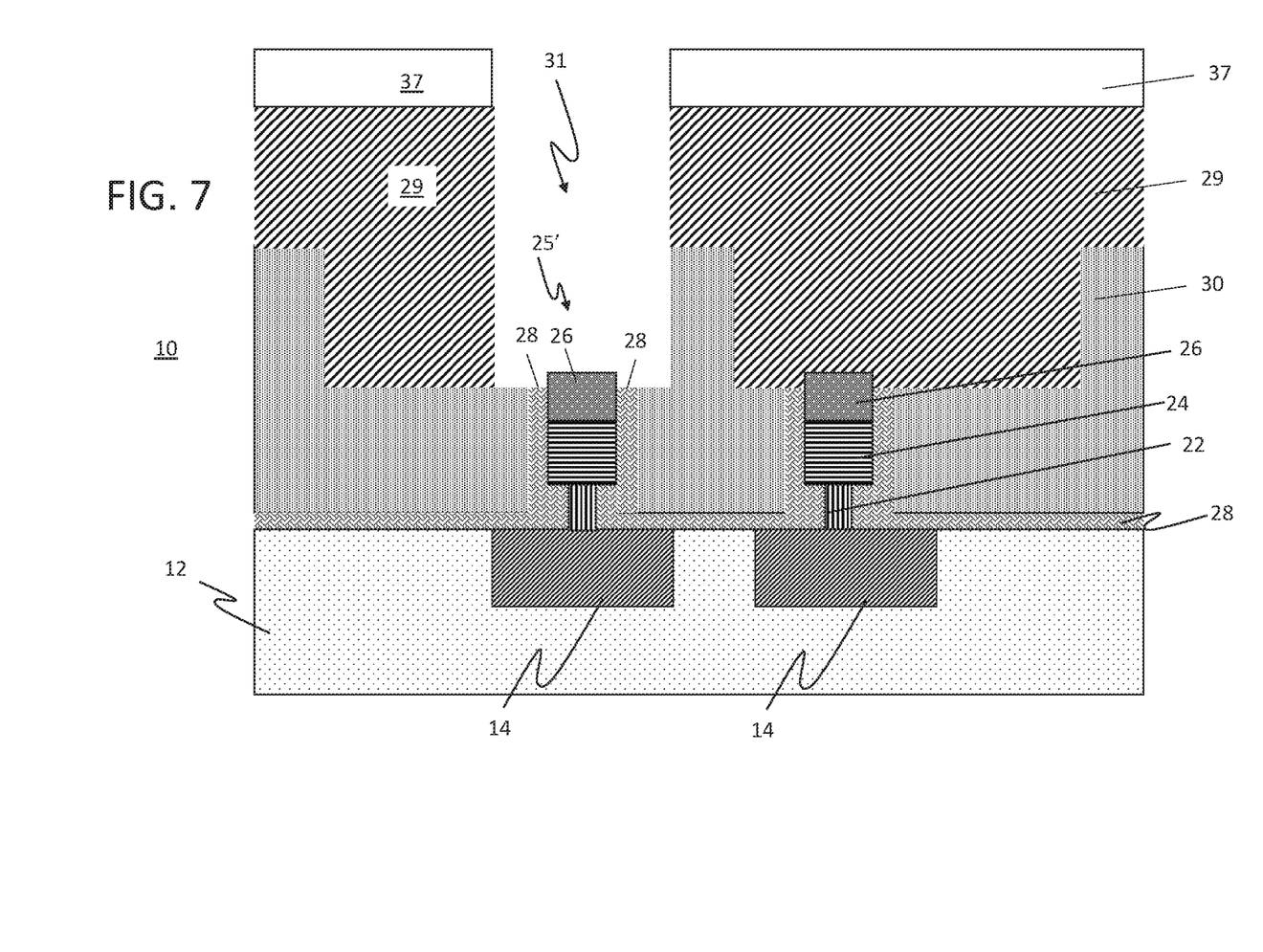
FIG. 7 is a cross-sectional view showing a blocking mask protecting a portion of the storage elements and other storage elements being exposed for removal by etching through the blocking mask in accordance with an embodiment of the present invention.

Referring to FIG. 7, a blocking layer 29 is formed over the device 10 and is patterned to open up areas where normal vias (interlevel vias) need to be formed. The blocking layer 29 can include a dielectric material or resist. The blocking layer 29 can be blanket deposited. The patterning can include a large area around a memory element 25' to be removed. This reduces the accuracy needed for alignment of an etch mask 37 formed to open up the blocking layer 29 by etching. The etch mask 37 can include a resist (or hard mask patterned using resist). The resist can be formed in accordance with lithographic patterning processes.

The blocking layer 29 is selectively etchable with respect to the ILD layer 30. This permits a large tolerance in aligning an etched trench 31 to the memory cell 25'. The blocking layer 29 is etched, using, e.g., RIE or other etch process, to expose the memory element 25'. Then, further etching selective to the ILD layer 30 is performed to remove the memory element 25' including the top electrode 26, the storage region 24, the bottom electrode 22 and portions of the cap layer 28. The thickness of the cap layer 28 can be employed to control the size of the opening that remains (trench 34, FIG. 8) when the element 25' is removed. The etching process can include a single process or multiple etching processes and/or chemistries.

Figure 8:
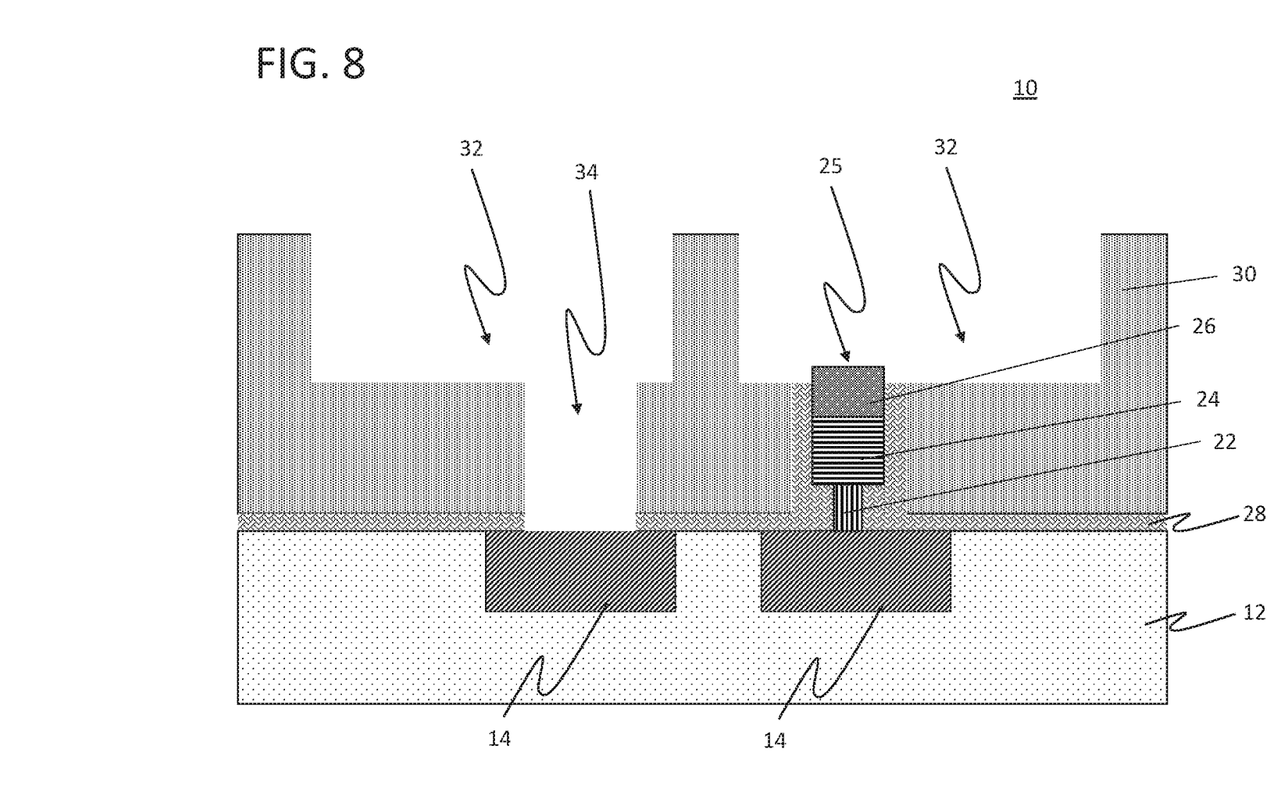
FIG. 8 is a cross-sectional view showing the blocking mask and a portion of the storage element removed where interlevel vias are to be formed in accordance with an embodiment of the present invention.

Referring to FIG. 8, the resist 37 and the blocking layer 29 are removed by an etching process, a planarization process or both. This leaves a trench 34 opened over the conductive structure 14 in the area for a via and reopens up trenches 32, one of which is in communication with trench 34 for vias. The top electrode 26 is exposed in areas where memory elements 25 are placed.

It should be noted that, in one embodiment, the top electrode 26 can be omitted from the stack 17 (FIG. 2) (e.g., so that storage element 24 would be exposed through the trench 32 and later when filled in using the conductive material 39 (FIG. 9), the top electrode could be formed. Also, while FIG. 8 shows the top electrode 26 protruding into trench 32, in one embodiment, the top electrode 26 can be equal or recessed to below a bottom of trench 32 and later filled in with material 39 (FIG. 9).

Figure 9:
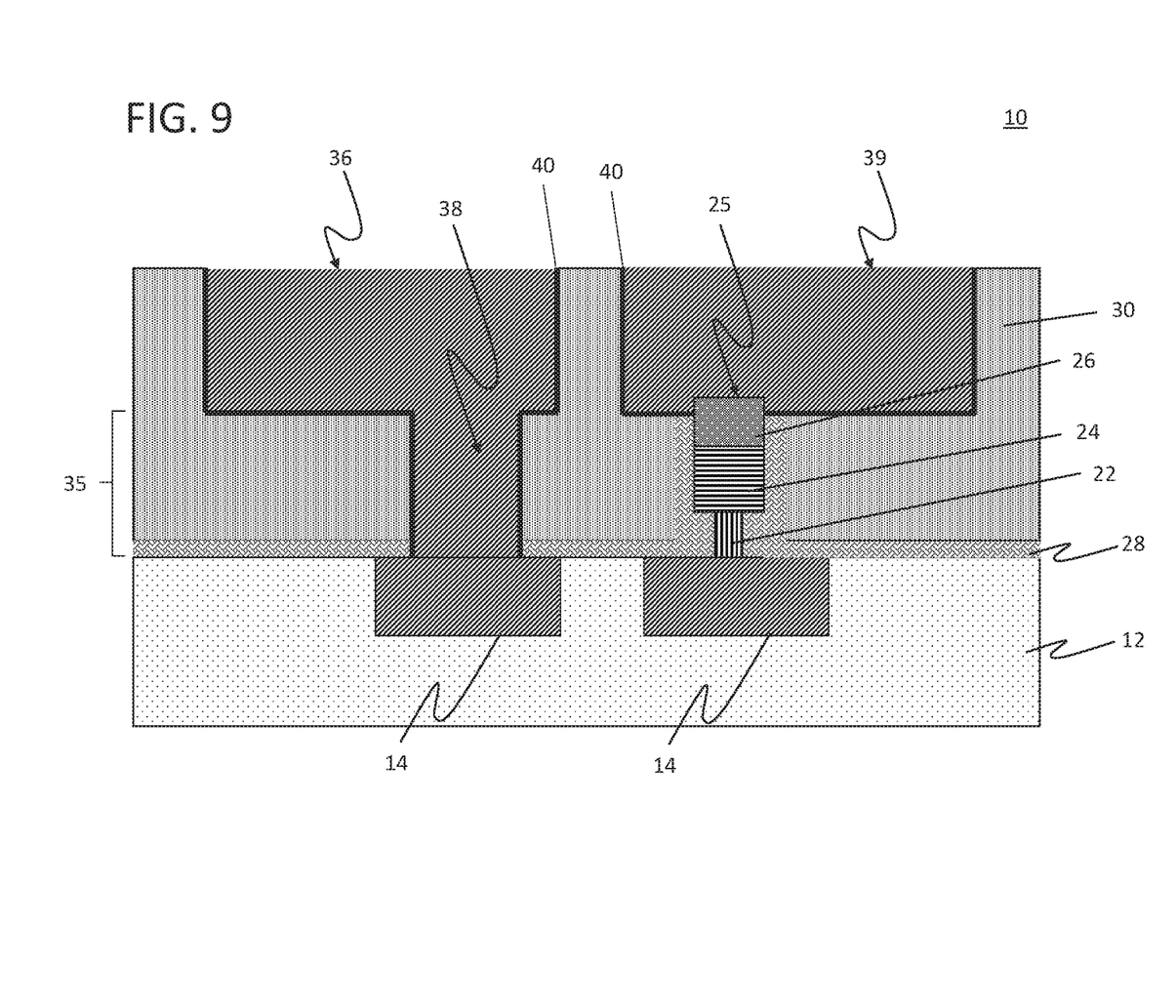
FIG. 9 is a cross-sectional view showing a conductive material deposited to form the interlevel via in a same metal layer as the storage element and metal lines of an adjacent metal layer concurrently formed in accordance with an embodiment of the present invention.

Referring to FIG. 9, a metal liner or diffusion barrier 40 can optionally be formed then metal conductors are deposited within trenches 32 and 34 (FIG. 8). The material of the diffusion barrier 40 can include, e.g., TaN, WN or other suitable materials. A seed layer may be formed on the walls of the trenches 32, 34 or on the diffusion barrier 40. This assists in the promotion of adhesion for the later deposited or formed metal/conductive material. In one embodiment, a metal material can be deposited by CVD, sputtering, evaporation, atomic layer deposition, electroplating, electroless plating or any other suitable metal deposition technique.

The metal/conductive material to form metal lines 36 and 39 can include any suitable conductive material, such as polycrystalline or amorphous silicon, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tungsten silicide, tungsten nitride, ruthenium oxide, cobalt silicide, nickel silicide), conductive carbon, graphene, or any suitable combination of these materials. The conductive material may further comprise dopants that are incorporated during or after deposition. In a particularly useful embodiment, the conduction material for lines or vias 36 and 39 includes copper with a copper seed layer.

A planarization process, e.g., CMP, is performed to remove access conductive material from a top surface of the ILD layer 30. This forms an interlevel via 38, metal line 36 and metal line 39. The via 38 is formed with the metal line 36 with conductive material formed in trench 34 and in trench 32 (FIG. 7). The via 38 extends through a single metal layer 35 (e.g., M2, etc.), but the conductive material is deposited concurrently for at least two metal layers (38 and 36/39). Also, within the same metal layer 35, an entire memory element 25 is formed along with its connection contact, via or metal line 39. Vias 38 have different uses and are formed in a same metal layer (35) as storage elements or memory devices 25 by a same integration process.

By forming metal lines 36 and 39 concurrently with the interlevel via 38 and also contacting/connecting the storage element 25, additional lithographic processing is avoided permitting a single exposure to form two levels of metallization. The storage element 25 and the interlevel via 38 are formed in a same metal layer and this provide multiple uses in a single metal layer.

Processing can continue with the formation of additional metal layers. The metal layers can include ILD layers, etch stop layers, cap layers, etc. and form vias or metal lines. The additional layers can also include memory elements within the height boundaries of the metal layers as described herein.

Figure 10:
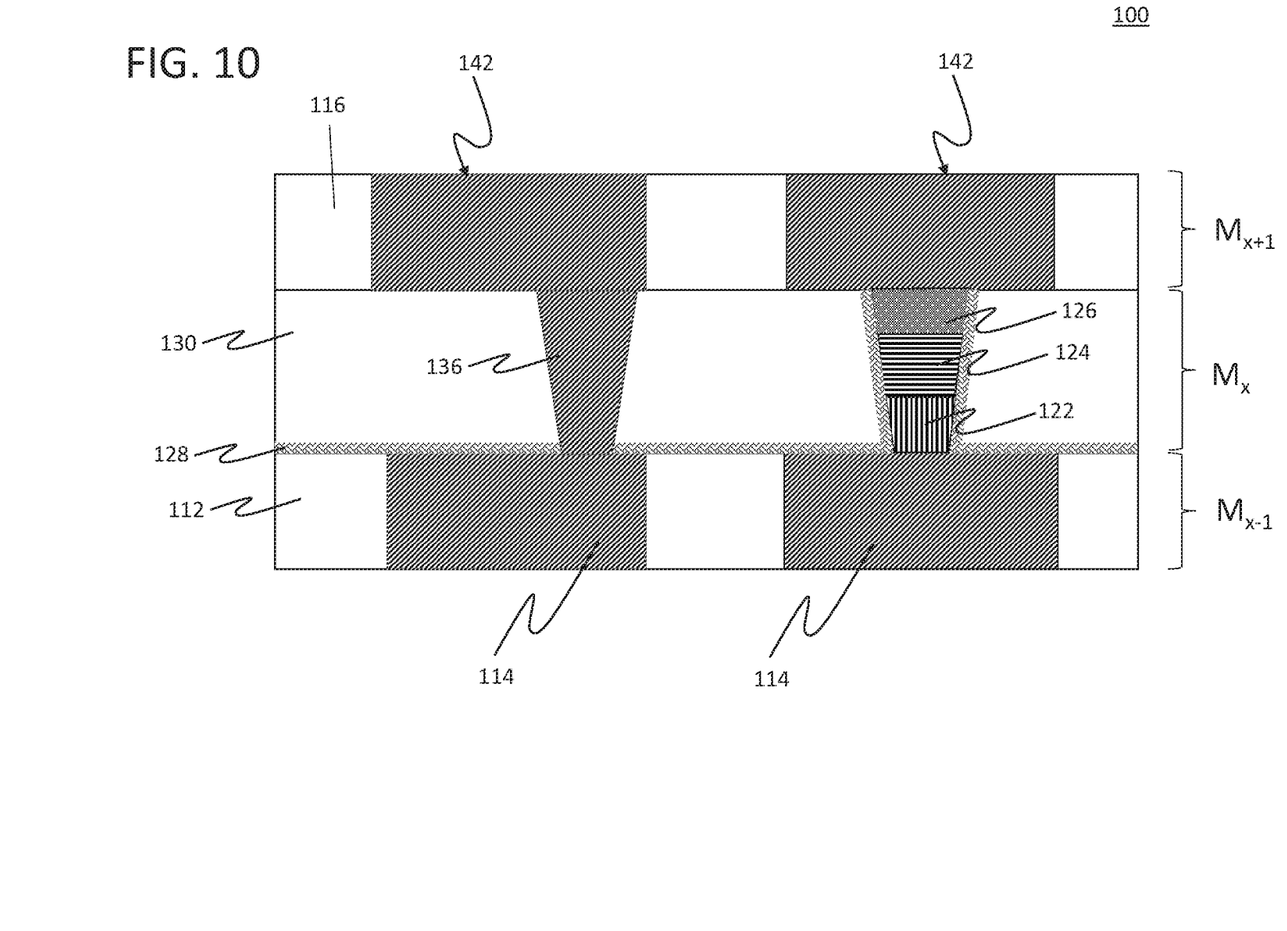
FIG. 10 is a cross-sectional view showing an interlevel via formed in a same metal layer as the storage element and metal lines of an adjacent metal layer concurrently formed in accordance with an embodiment of the present invention.

Referring to FIG. 10, in another embodiment, a memory element 125 in a memory device 100 has a similar structure as memory element 25 including a bottom electrode 122, a data storage region 124 and a top electrode 126. In one embodiment, the top electrode 126 can be formed concurrently using a same conductive material with via 136 and conductive structures 142. In another embodiment, top electrode 126 is formed with a stack of layers used to also form the data storage region 124 and the bottom electrode 122.

The memory element 125 and the via 136 (e.g., a normal via or interlevel via) are disposed wholly in metal layer $M_x$ and connect conductive structures 114 in layer $M_{x-1}$ with conductive structures 142 in metal layer $M_{x+1}$. Conductive structures 114, conductive structures 142, memory element 125 and the via 136 are disposed within dielectric materials 112, 130, 116, e.g., ILD layers. A cap layer 128 (like cap layer 28) runs between dielectric layer 130 and dielectric layer 112 with conductive structures 114. The cap layer 128 also lines the walls of the memory element 125. It should be understood that memory elements 125 can be employed in multiple metal layers, e.g., metal layers $M_x$, $M_{x-1}$, $M_{x+1}$, etc.

Other materials and layers, e.g. diffusion barriers etc. can be employed as well within the trenches in which the vias 38, 136 and memory elements 25, 125 are formed. In addition, while memory elements are described for use with the normal via in a same metal layer, other components or structures may be employed for use in accordance with aspects of the present invention. For example, instead of or in addition to the memory element, a fuse or anti-fuse structure, a resistor, a capacitor, etc. can be employed.

Figure 11:
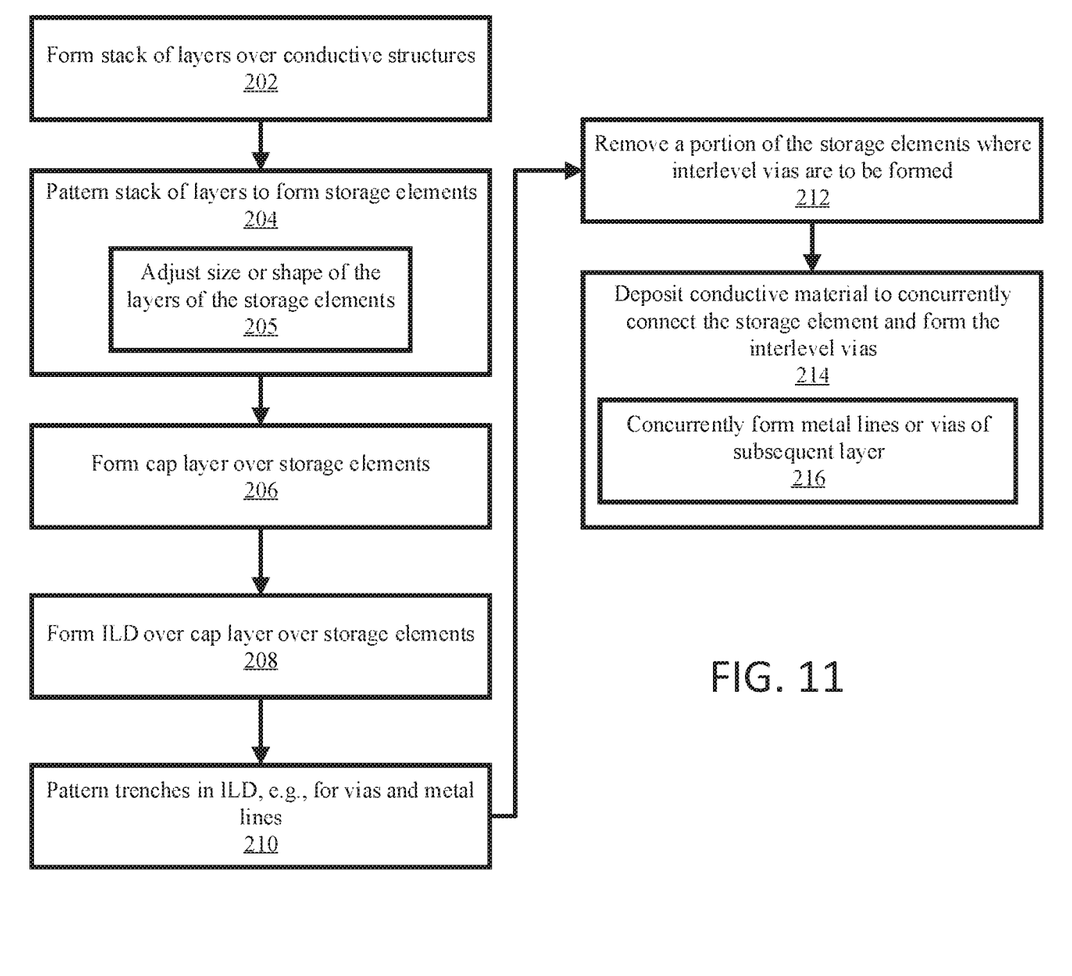
FIG. 11 is a block/flow diagram showing methods for multifunction single via patterning in accordance with embodiments of the present invention.

Referring to FIG. 11, methods for semiconductor device fabrication are illustratively shown in accordance with aspects of the present invention. In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In block 202, a stack of layers is formed over an underlying layer. The underlying layer includes conductive structures formed therein (or thereon). The underlaying layer can include, e.g., a previous metal layer or a semiconductor substrate with conductive regions. The stack of layers can include at least an electrode layer and a memory material layer. In one embodiment, the stack of layers includes a bottom electrode, a memory material, e.g., PCM or adjustable resistive material, etc. and a top electrode. Other layers of materials can be employed instead of or in addition to these layers.

In block 204, the stack of layers is patterned, by e.g., lithographic processing, to form storage elements on conductive structures. The storage elements can include PCM elements, resistive elements for RRAM, or any other element capable of storing a change in state. In block 205, a continued or additional etch process can be performed to adjust the shapes and sizes of the different layers of the storage elements. For example, the bottom electrode can be made thinner than the top electrode or the memory material by controlling the etch chemistry and etch times. In one embodiment, the bottom electrode and the top electrode are made from different materials.

In block 206, a cap layer is formed over the storage elements and the underlying layer having the conductive structures. The cap layer provides protection during operation and further processing and provides etch selectivity for subsequent etching.

In block 208, an interlevel dielectric (ILD) layer is formed over the cap layer. The ILD layer can represent two metal layers. One metal layer where the storage elements and interlevel vias to be formed are disposed, and one where a subject adjacent metal layers or vias are to be formed. In this way, an additional lithographic patterning process and associated fabrication steps are avoided.

In block 210, trenches are patterned/etched into the ILD layer to expose a top portion of the storage elements. The trenches can provide space where metal lines or vias for a different metal layer than the storage element layer can be formed.

In block 212, a portion of the storage elements where interlevel vias are to be formed are removed, e.g., by selective etching. This exposes the conductive structures therebelow and forms via openings. The storage elements that are removed act as place holders in the structure for later formed vias that will replace the removed the storage elements.

In block 214, a conductive material is deposited in the trenches and the via openings to concurrently make contact with the storage elements and form interlevel vias in the via openings. The conductive material can also concurrently form metal lines for an adjacent metal layer. The conductive material in the trenches and the via openings can include metal lines on a subsequent metal layer while concurrently making contact with the storage elements and forming the interlevel vias in the via openings. The storage elements and the interlevel vias are completely formed within a same metal layer.

Having described preferred embodiments of multifunction single via patterning (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for semiconductor device fabrication, comprising:
    forming storage elements on conductive structures;
    depositing a cap layer over the storage elements and the conductive structures;
    forming an interlevel dielectric (ILD) layer over the cap layer;
    patterning trenches in the ILD layer to expose a top portion of the storage elements;
    removing the storage elements where interlevel vias are to be formed to expose the conductive structures therebelow to form via openings; and
    depositing a conductive material in the trenches and the via openings to concurrently make contact with the storage elements and form interlevel vias in the via openings.

2. The method as recited in claim 1, wherein forming the storage elements on the conductive structures includes:
depositing a stack of layers over the conductive structures; and
patterning the stack of layers to form the storage elements.

3. The method as recited in claim 2, wherein depositing the stack of layers includes:
depositing a first electrode layer; and
depositing a memory material layer over the first electrode layer.

4. The method as recited in claim 3, further comprising:
depositing a second electrode layer over the memory material layer.

5. The method as recited in claim 2, wherein patterning the stack of layers includes:
etching the stack of layers to adjust sizes of structures in different layers of the storage elements.

6. The method as recited in claim 1, wherein the storage elements include a phase change memory material.

7. The method as recited in claim 1, wherein the storage elements include an adjustable resistive memory.

8. The method as recited in claim 1, wherein depositing the conductive material in the trenches and the via openings includes forming metal lines on a subsequent metal layer while concurrently making contact with the storage elements and forming the interlevel vias in the via openings.

9. The method as recited in claim 1, wherein the storage elements and the interlevel vias are completely formed within a same metal layer.

10. A method for semiconductor device fabrication, comprising:
forming a stack of layers over an underlying layer having conductive structures formed therein, the stack of layers including at least an electrode layer and a memory material layer;
patterning the stack of layers to form storage elements on conductive structures;
depositing a cap layer over the storage elements and the conductive structures;
forming an interlevel dielectric (ILD) layer over the cap layer;
patterning trenches in the ILD layer to expose a top portion of the storage elements;
removing the storage elements where interlevel vias are to be formed to expose the conductive structures therebelow to form via openings; and
depositing a conductive material in the trenches and the via openings to concurrently make contact with the storage elements and form interlevel vias in the via openings.

11. The method as recited in claim 10, wherein forming the stack of layers further comprises depositing a second electrode layer over the memory material layer.

12. The method as recited in claim 10, wherein patterning the stack of layers includes:
etching the stack of layers to adjust sizes of structures in different layers of the storage elements.

13. The method as recited in claim 10, wherein the memory material layer includes a phase change memory material.

14. The method as recited in claim 10, wherein the memory material layer includes an adjustable resistive memory.

15. The method as recited in claim 10, wherein depositing the conductive material in the trenches and the via openings includes forming metal lines on a subsequent metal layer while concurrently making contact with the storage elements and forming the interlevel vias in the via openings.

16. The method as recited in claim 10, wherein the storage elements and the interlevel vias are completely formed within a same metal layer.

* * * * *